(12) United States Patent
Fukuhara et al.

(10) Patent No.: US 7,517,621 B2
(45) Date of Patent: Apr. 14, 2009

(54) EXPOSURE METHOD AND METHOD FOR MANUFACTURING SEMICONDUCTOR DEVICE

(75) Inventors: Kazuya Fukuhara, Tokyo (JP); Kenji Kawano, Yokohama (JP); Kazuyuki Masukawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 21 days.

(21) Appl. No.: 11/896,871

(22) Filed: Sep. 6, 2007

(65) Prior Publication Data
US 2008/0063988 A1    Mar. 13, 2008

(30) Foreign Application Priority Data
Sep. 8, 2006    (JP) .............................. 2006-244426

(51) Int. Cl.
*G03C 5/00* (2006.01)
(52) U.S. Cl. ......................................... 430/30; 430/311
(58) Field of Classification Search .................. 430/30, 430/311
See application file for complete search history.

(56) References Cited

U.S. PATENT DOCUMENTS 6,403,413 B2    6/2002    Hayano et al.
6,893,801 B2    5/2005    Inoue et al.
7,001,712 B2    2/2006    Imai et al.

FOREIGN PATENT DOCUMENTS

| JP | 3441140 | 6/2003 |
| JP | 2003-234285 | 8/2003 |
| JP | 2005-55878 | 3/2005 |

OTHER PUBLICATIONS

Notification of Reasons for Rejection (Office Action) for Japanese Patent Application No. 2006-244426, mailed Dec. 16, 2008, and English translation thereof.

*Primary Examiner*—Christopher G Young
(74) *Attorney, Agent, or Firm*—Finnegan, Henderson, Farabow, Garrett & Dunner, L.L.P.

(57) ABSTRACT

An exposure method includes preparing a photomask having first and second main openings by which corresponding patterns are to be formed in a photo resist and first and second assist openings by which no corresponding patterns are to be formed in the photo resist, preparing an illumination having first and second light emitting areas, and irradiating the photo resist with illumination light from the illumination via the photomask, the first light emitting area and the second light emitting area being symmetric with respect to a center of the illumination, the first light emitting area and the second light emitting area containing a first point and a second point, respectively, the first point and the second point being symmetric with respect to the center of the illumination, the first point and the second point being symmetric with respect to a straight line extending through the center of the illumination.

20 Claims, 10 Drawing Sheets

EXPOSURE METHOD AND METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2006-244426, filed Sep. 8, 2006, the entire contents of which are incorporated herein by reference.

BACKGROUND OF THE INVENTION

1. Field of the Invention

The present invention relates to an exposure method and a method for manufacturing a semiconductor device.

2. Description of the Related Art

Figure 21:
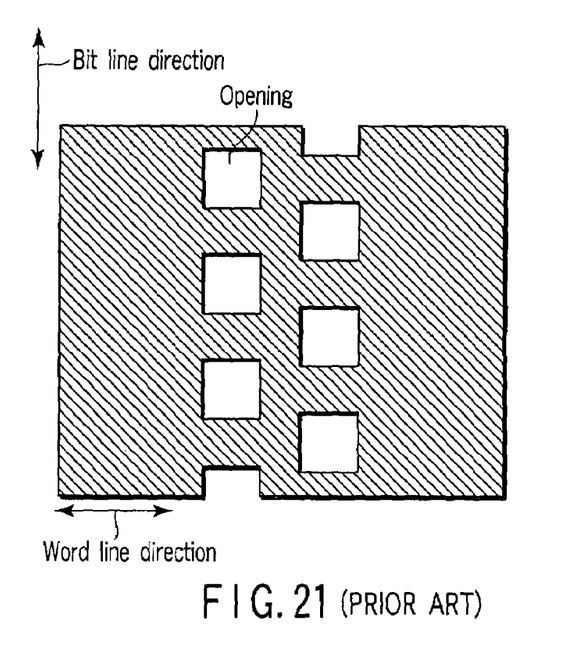
FIG. 21 is a diagram schematically showing a photomask in accordance with the prior art.

To increase the integration degree of semiconductor integrated circuit devices, it is important to form patterns at a high density. Thus, for example, a NAND flash memory has been proposed which has contact holes for bit line contact displaced from one another (see, for example, Japanese Patent No. 3441140). FIG. 21 is a diagram showing mask patterns used to form the contact holes. As shown in the figure, openings (light transmission portions) used to form the contact holes are displaced from one another.

However, the above opening patterns are dense in an oblique direction, reducing the sizes of process windows indicating exposure latitude (EL) and the depth of focus (DOF). This makes it difficult to inhibit possible dimensional errors during an exposure step. Consequently, it has been difficult to form accurate patterns with possible dimensional errors inhibited.

BRIEF SUMMARY OF THE INVENTION

A first aspect of the present invention, there is provided an exposure method comprising: preparing a photomask having first main openings and second main openings by which corresponding patterns are to be formed in a photo resist and first assist openings and second assist openings by which no corresponding patterns are to be formed in the photo resist; preparing an illumination having a first light emitting area and a second light emitting area; and irradiating the photo resist with illumination light from the illumination via the photomask, the first main openings being arranged at a first pitch on a first straight line extending in a first direction, the second main openings being arranged at the first pitch on a second straight line extending in the first direction and being away from the first straight line by a first distance, the second main openings being displaced relative to the first main openings by half the first pitch in the first direction, the first assist openings being arranged at the first pitch on a third straight line extending in the first direction and being away from the first straight line by the first distance and away from the second straight line by double the first distance, the first assist openings being displaced relative to the first main openings by half the first pitch in the first direction, the second assist openings being arranged at the first pitch on a fourth straight line extending in the first direction and being away from the second straight line by the first distance and away from the first straight line by double the first distance, the second assist openings being displaced relative to the second main openings by half the first pitch in the first direction, the first light emitting area and the second light emitting area being symmetric with respect to a center of the illumination, the first light emitting area and the second light emitting area containing a first point and a second point, respectively, the first point and the second point being symmetric with respect to the center of the illumination, the first point and the second point being symmetric with respect to a straight line extending through the center of the illumination in a second direction perpendicular to the first direction.

A second aspect of the present invention, there is provided a method for manufacturing a semiconductor device, the method comprising: exposing a photo resist by the above method; and developing the exposed photo resist to form a photo resist pattern.

DETAILED DESCRIPTION OF THE INVENTION

Embodiments of the present invention will be described below with reference to the drawings.

Embodiment 1

A first embodiment of the present invention will be described. In the description of the present embodiment and the other embodiments, contact holes for bit line contact in a NAND flash memory are formed.

Figure 1:
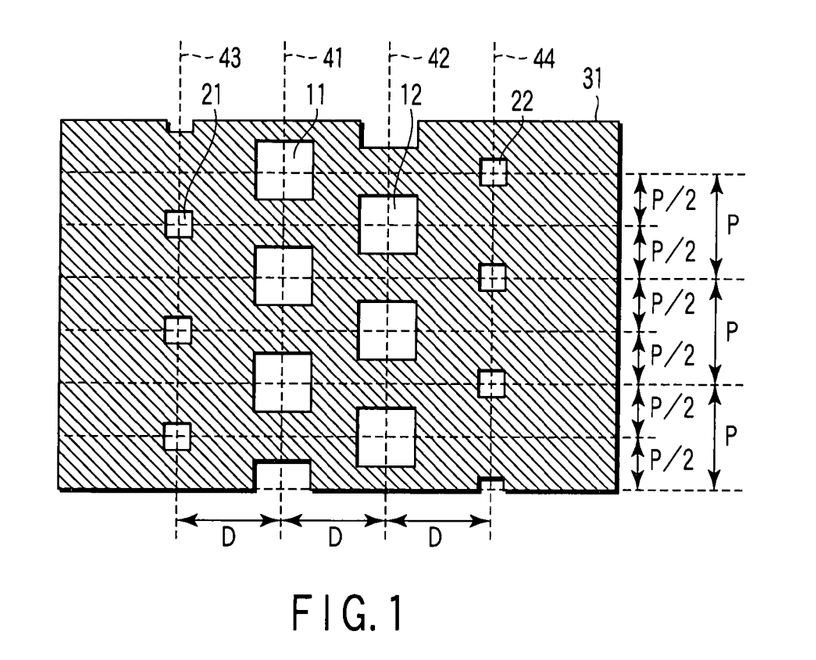
FIG. 1 is a diagram schematically showing a photomask in accordance with a first embodiment of the present invention.

FIG. 1 is a diagram schematically showing a photomask in accordance with the present embodiment.

The photomask shown in FIG. 1 has main openings (first main openings) 11, main openings (second main openings) 12, assist openings (first assist openings) 21, and assist openings (second assist openings) 22. These openings are surrounded by an opaque area 31. The opaque area 31 is an opaque area in which, for example, a chromium film is formed or an attenuated phase shift area in which, for example, a molybdenum silicide film is formed. Each of the main openings 11 and each of the main openings 12 have the same shape and the same size. Each of the assist openings 21 and each of the assist openings 22 have the same shape and the same size. Each of the assist openings 21 and 22 are smaller than each of the main openings 11 and 12.

The main openings 11 and 12 constitute patterns corresponding to contact hole patterns for bit line contact. Patterns corresponding to the main openings 11 and 12 are formed in a photo resist after an exposure step and a development step. The assist openings 21 and 22 constitute auxiliary patterns. The patterns corresponding to the assist openings 21 and 22 are not formed in the photo resist after the exposure step and the development step.

The main openings 11 are arranged at a pitch P (first pitch) on a straight line (first straight line) 41 extending in a bit line direction (first direction). That is, the center of each main opening 11 is positioned on the straight line 41. The main openings 12 are arranged at the pitch P on a straight line (second straight line) 42 extending in the bit line direction. That is, the center of each main opening 12 is positioned on the straight line 42. The straight lines 41 and 42 are parallel to each other. The distance (first distance) between the straight lines 41 and 42 is denoted as D. The main openings 11 are displaced from the main openings 12 by P/2 in the bit line direction.

The assist openings 21 are arranged at the pitch P on a straight line (third straight line) 43 extending in the bit line direction. That is, the center of each assist opening 21 is positioned on the straight line 43. The assist openings 22 are arranged at the pitch P on a straight line (fourth straight line) 44 extending in the bit line direction. That is, the center of each assist opening 22 is positioned on the straight line 44. The straight lines 41, 42, 43, and 44 are parallel to one another. The distance between the straight lines 41 and 43 is denoted by D. The distance between the straight lines 42 and 44 is denoted by D. The assist openings 21 are displaced from the main openings 11 by P/2 in the bit line direction. Similarly, the assist openings 22 are displaced from the main openings 12 by P/2 in the bit line direction. Consequently, the assist openings 21 are displaced from the assist openings 22 by P/2 in the bit line direction.

As is apparent from the above description, the assist openings 21, the main openings 11, the main openings 12, and the assist openings 22 are arranged at the same pitch in an oblique direction. That is, the photomask shown in FIG. 1 has a periodicity increased by the added assist openings 21 and 22.

Figure 2:
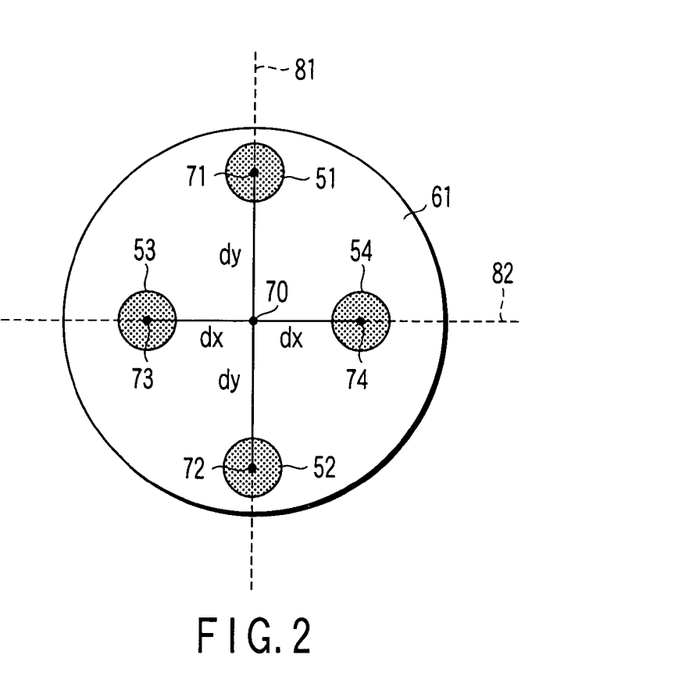
FIG. 2 is a diagram schematically showing an illumination in accordance with the first embodiment of the present invention.

FIG. 2 is a diagram schematically showing an illumination in accordance with the present embodiment.

As shown in FIG. 2, the illumination has a light emitting area (first light emitting area) 51, a light emitting area (second light emitting area) 52, a light emitting area (third light emitting area) 53, and a light emitting area (fourth light emitting area) 54. The light emitting areas 51, 52, 53, and 54 are surrounded by a non-light-emitting area 61.

The light emitting area 51 and the light emitting area 52 are symmetric with respect to the center 70 of the illumination. That is, the light emitting area 51 and the light emitting area 52 have the same shape and the same size. The center of the light emitting area 51 and the center of the light emitting area 52 are symmetric with respect to the center 70 of the illumination. The light emitting area 51 and the light emitting area 52 contain a point (first point) 71 and a point (second point) 72, respectively. The point 71 and the point 72 are symmetric with respect to the center 70 of the illumination. The point 71 and the point 72 are symmetric with respect to a straight line 82 extending through the center 70 of the illumination in a word line direction (x direction, second direction) perpendicular to the bit line direction (y direction, first direction). That is, the distance (dy) between the center 70 of the illumination and the point 71 is equal to the distance (dy) between the center 70 of the illumination and the point 72. Ideally, the center of the light emitting area 51 desirably coincides with the point 71. The center of the light emitting area 52 desirably coincides with the point 72. In this case, the light emitting area 51 and the light emitting area 52 are symmetric with respect to the straight line 82.

The light emitting area 53 and the light emitting area 54 are symmetric with respect to the center 70 of the illumination. That is, the light emitting area 53 and the light emitting area 54 have the same shape and the same size. The center of the light emitting area 53 and the center of the light emitting area 54 are symmetric with respect to the center 70 of the illumination. The light emitting area 53 and the light emitting area 54 contain a point (third point) 73 and a point (fourth point) 74, respectively. The point 73 and the point 74 are symmetric with respect to the center 70 of the illumination. The point 73 and the point 74 are symmetric with respect to a straight line 81 extending in the bit line direction (y direction, first direction) through the center 70 of the illumination. That is, the distance (dx) between the center 70 of the illumination and the point 73 is equal to the distance (dx) between the center 70 of the illumination and the point 74. Ideally, the center of the light emitting area 53 desirably coincides with the point 73. The center of the light emitting area 54 desirably coincides with the point 74. In this case, the light emitting area 53 and the light emitting area 54 are symmetric with respect to the straight line 81.

When the wavelength of illumination light is defined as $\lambda$ and the numerical aperture of a projection lens through which the illumination light passes is defined as NA, the distance dy between the center 70 of the illumination and the point 71 and the distance dy between the center 70 of the illumination and the point 72 desirably satisfy the following relationship in an illumination σ coordinate system.

$$dy = (\lambda/4NA) \times ((P/D^2) + (1/P)) \qquad \text{[Formula 1]}$$

The σ coordinate system will be described below.

The distance dx between the center 70 of the illumination and the point 73 and the distance dx between the center 70 of the illumination and the point 74 desirably satisfy the following relationship in an illumination σ coordinate system.

$$dx=(\lambda/4NA) \times ((D/P^2)+(1/D))$$ [Formula 2]

Figure 3:
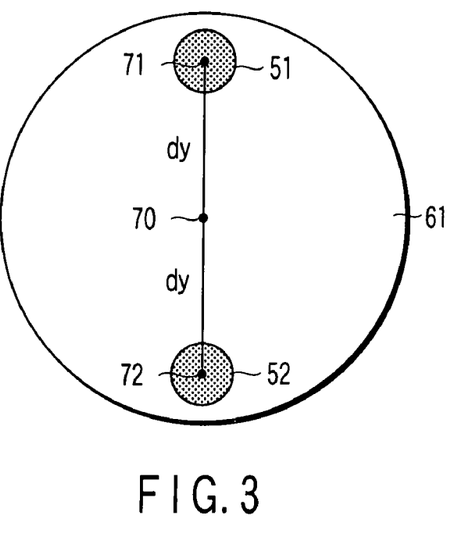
FIG. 3 is a diagram schematically showing a variation of the illumination in accordance with the first embodiment of the present invention.

The example in FIG. 2 uses a quadrupole illumination having the four light emitting areas 51, 52, 53, and 54. However, a dipole illumination having the two light emitting areas 51 and 52 may be used as shown in FIG. 3. That is, the illumination has only to have at least the light emitting areas 51 and 52 and need not necessarily have the light emitting areas 53 and 54. The configuration, arrangement, and the like of the light emitting areas 51 and 52 in FIG. 3 are similar to those of the light emitting areas 51 and 52, described with reference to FIG. 2.

Irradiation of the photo resist with illumination light from the above illumination (shown in FIG. 2 or 3) via the above photomask (shown in FIG. 1) makes it possible to form accurate contact hole patterns with possible dimensional errors inhibited.

Figure 4:
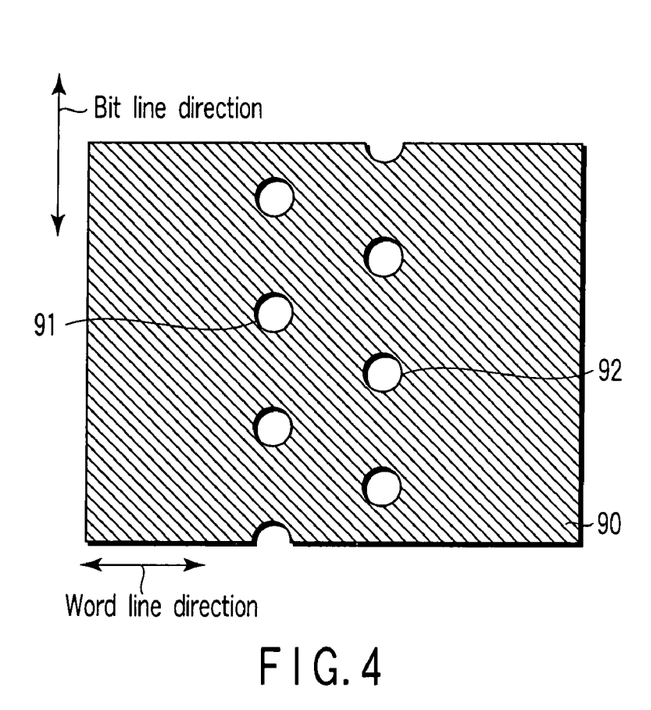
FIG. 4 is a diagram schematically showing photo resist patterns in accordance with the first embodiment of the present invention.

FIG. 4 is a diagram schematically showing patterns formed in the photo resist after the exposure and development steps. As shown FIG. 4, contact hole patterns 91 and 92 are formed in a photo resist 90. That is, the pattern corresponding to the main openings 11 and 12, shown in FIG. 1, is formed in the photo resist 90 as the contact hole patterns 91 and 92. The patterns corresponding to the assist openings 21 and 22, shown in FIG. 1, are not formed in the photo resist 90.

Figure 5:
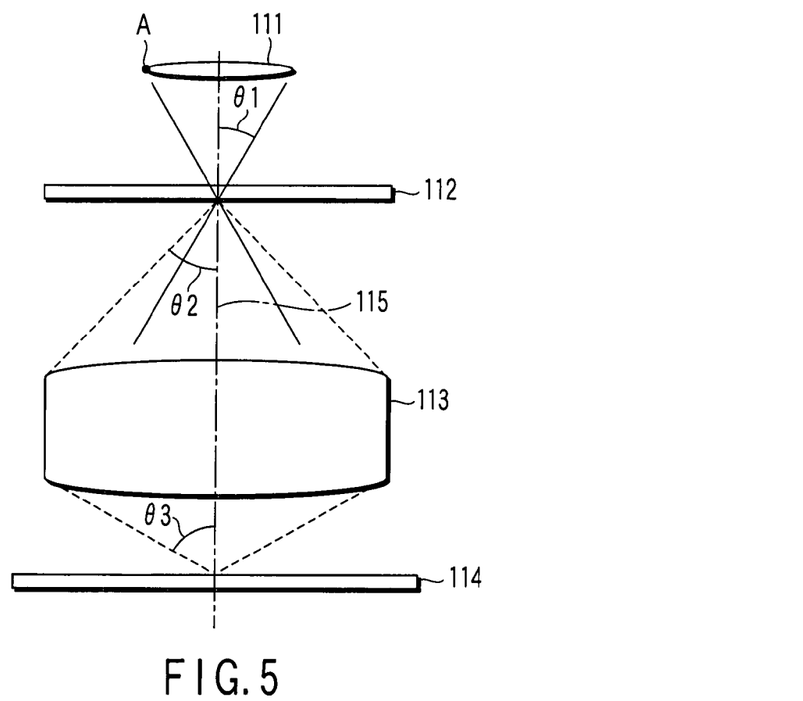
FIG. 5 is a diagram illustrating an illumination a coordinate system.

Now, the above σ coordinate system will be described with reference to FIG. 5. In FIG. 5, reference numeral 111 denotes an illumination optical system, reference numeral 112 denotes a photomask, and reference numeral 113 denotes a projection optical system (projection lens). Reference numeral 114 denotes a substrate (semiconductor wafer) and reference numeral 115 denotes an optical axis. NA of the illumination optical system 111 is denoted by $\sin(\theta 1)$. The mask side NA of the projection optical system 113 is denoted by $\sin(\theta 2)$. The σ value is defined as $\sin(\theta 1)/\sin(\theta 2)$.

For a modified illumination such as a dipole illumination or a quadrupole illumination, the σ coordinate system is generally used with the definition of the σ value expanded. In the σ coordinate system, the optical axis corresponds to an origin, and the mask side NA of the projection optical system is normalized to 1. Accordingly, the illumination position of a point A in FIG. 5 can be represented in the σ coordinate system as follows.

$$(\sigma x, \sigma y)=(\sin(\theta)/\sin(\theta 2), 0)$$

Description will be given of the reason why accurate patterns with possible dimensional errors inhibited can be formed by an exposure method using the photomask (shown in FIG. 1) and the illumination (shown in FIG. 2 or 3).

Figure 6:
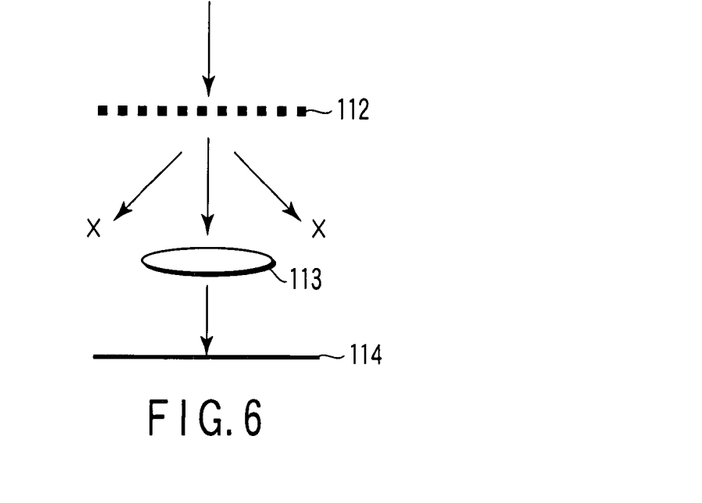
FIG. 6 is a diagram illustrating effects of an embodiment of the present invention.
Figure 7:
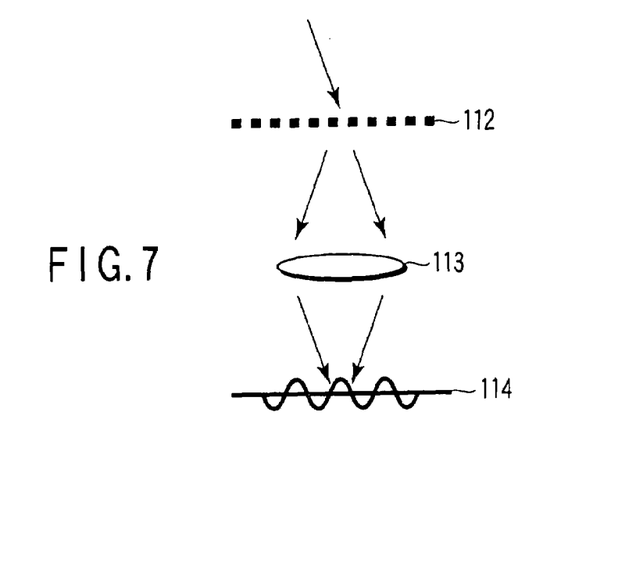
FIG. 7 is a diagram illustrating effects of an embodiment of the present invention.

If, in dimensions on the substrate, pattern interval is smaller than $(\lambda/NA)$, the use of vertical illumination light prevents the diffraction lights other than 0th-order diffraction light from reaching the substrate. This prevents light interference and thus image formation (see FIG. 6). The use of an oblique illumination (off-axis illumination) results in the interference between the 0th-order diffraction light and 1st-order diffraction light, enabling image formation (see FIG. 7).

With the oblique illumination, periodic dense patterns have a greater depth of focus (DOF) than an isolated pattern. Thus, the present embodiment adds the assist openings 21 and 22, shown in FIG. 1, to provide the entire patterns with periodicity. That is, since the main openings 11 and main openings 12, shown in FIG. 1, are arranged in the oblique direction, the addition of the assist openings 21 and 22 enables an increase in the periodicity in the oblique direction.

Now, description will be given of the reason why the illumination shown in FIG. 2 or FIG. 3 is desirable. Here, for simplification of the description, the dipole illumination shown in FIG. 3 is assumed. However, a similar discussion also applies to the quadrupole illumination shown in FIG. 2.

Figure 8:
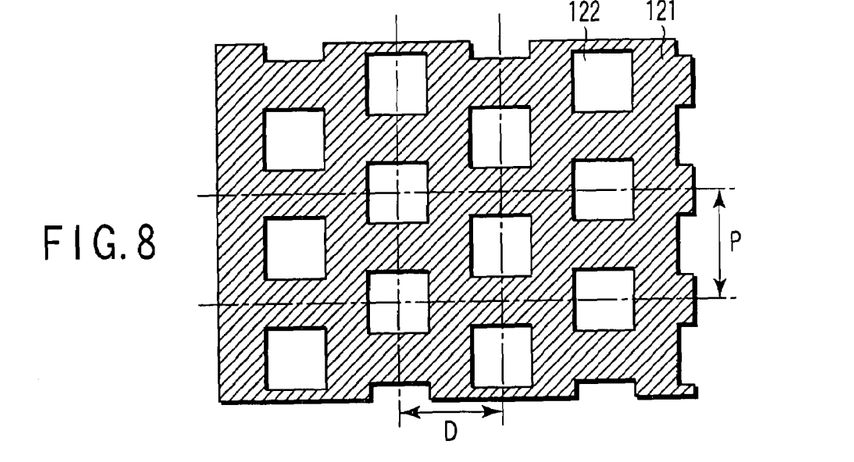
FIG. 8 is a diagram illustrating effects of an embodiment of the present invention.

The mask patterns shown in FIG. 1, consisting diffraction grating, can be considered to generate diffraction light in the same direction as that in which mask patterns shown in FIG. 8 generate diffraction light. In FIG. 8, reference numerals 121 and 122 denote an opaque area and an opening, respectively.

Figure 9:
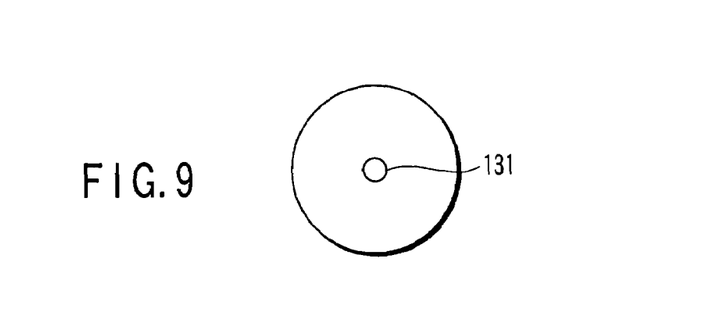
FIG. 9 is a diagram illustrating effects of an embodiment of the present invention.
Figure 10:
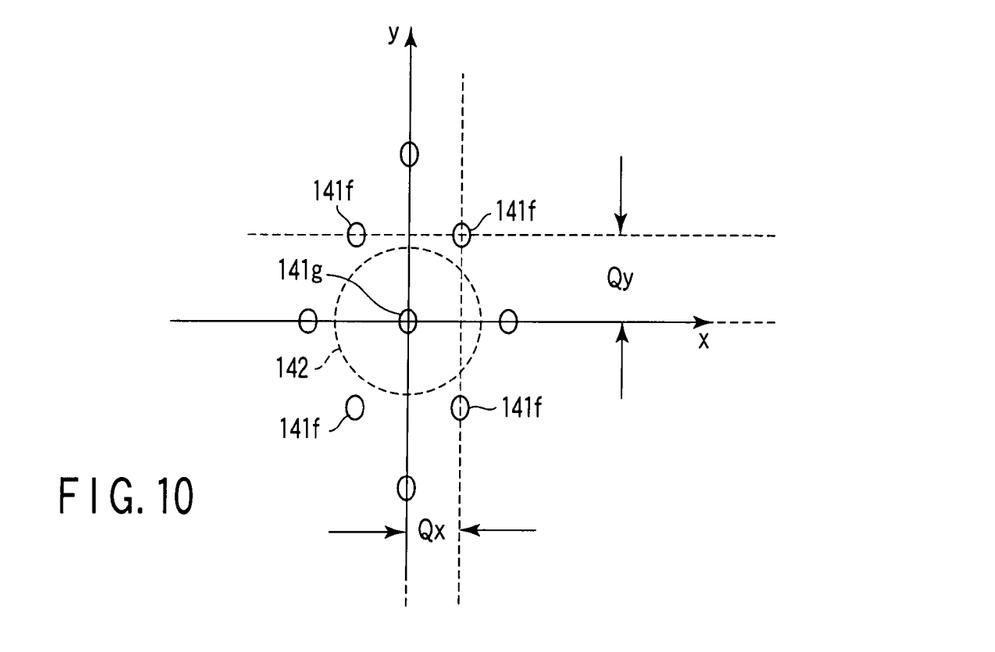
FIG. 10 is a diagram illustrating effects of an embodiment of the present invention.

It is assumed that the mask patterns shown in FIG. 8 are irradiated with vertical illumination light from an illumination shown in FIG. 9. That is, the illumination in FIG. 9 has a light emitting area 131 in the center of the illumination. In this case, diffraction light at a surface corresponding to a projection lens pupil exhibits such a distribution as shown in FIG. 10. The coordinate system in FIG. 10 is a σ coordinate system with the radius of the projection lens pupil normalized to 1.

In FIG. 10, reference numeral 141*g* denotes the 0-th-order diffraction light, and reference numeral 141*f* denotes the 1st-order diffraction light. The coordinate positions of the four 1st-order diffraction lights 141*f* are:

(+Qx, +Qy)
(+Qx, −Qy)
(−Qx, +Qy) and
(−Qx, −Qy).

In this case, the following formulae are given.

$$Qx=\lambda/(2D \times NA)$$

$$Qy=\lambda/(2P \times NA)$$

Reference character λ denotes the wavelength of the illumination light. Reference character NA denotes the numerical aperture of the projection lens (projection optical system). Reference characters D and P are similar to those specified in FIG. 1. That is, in FIG. 8, D denotes the distance between straight lines extending in a y direction through the center of opening 122. P denotes a pitch of the openings 122 in the y direction. Reference numeral 142 denotes an effective area of the projection lens pupil. Only the diffraction lights in the effective area 142 reach the substrate. In FIG. 10, only one diffraction light (0th-order diffraction light 141*g*) reaches the substrate. Thus, no image is formed on the substrate.

Figure 11:
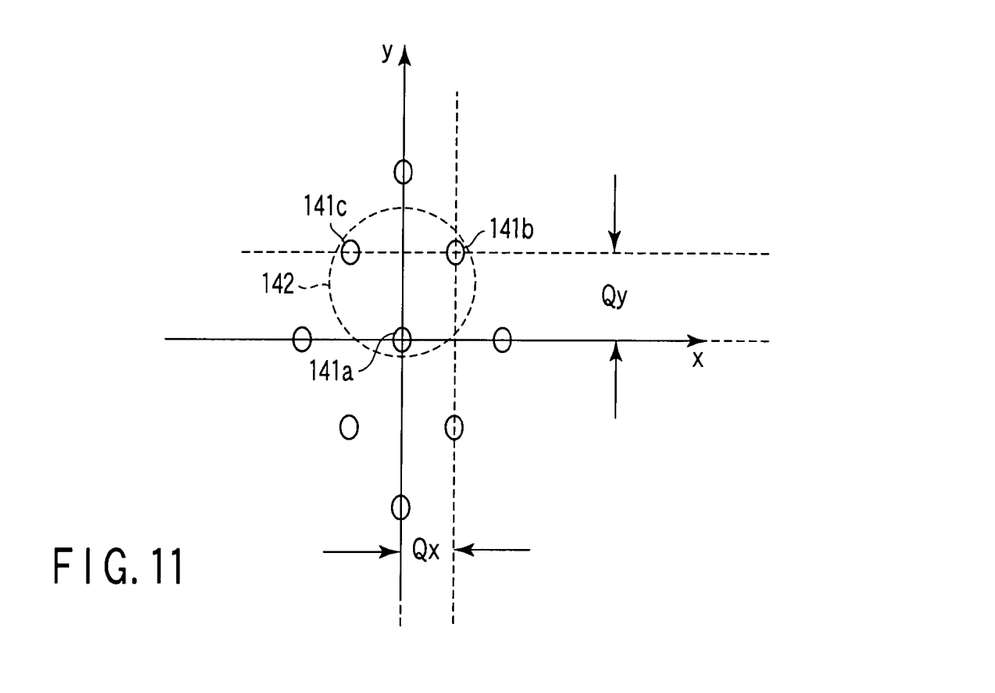
FIG. 11 is a diagram illustrating effects of an embodiment of the present invention.

It is assumed that the mask patterns shown in FIG. 8 are irradiated with oblique illumination light. Appropriately shifting the position of the oblique illumination light in the y axis direction enables three diffraction lights 141*a*, 141*b*, and 141*c* to be positioned in the effective area 142 of the projection lens pupil as shown in FIG. 11. Consequently, the three diffraction lights reach the substrate through the projection lens, enabling an image to be formed on the substrate.

Figure 12:
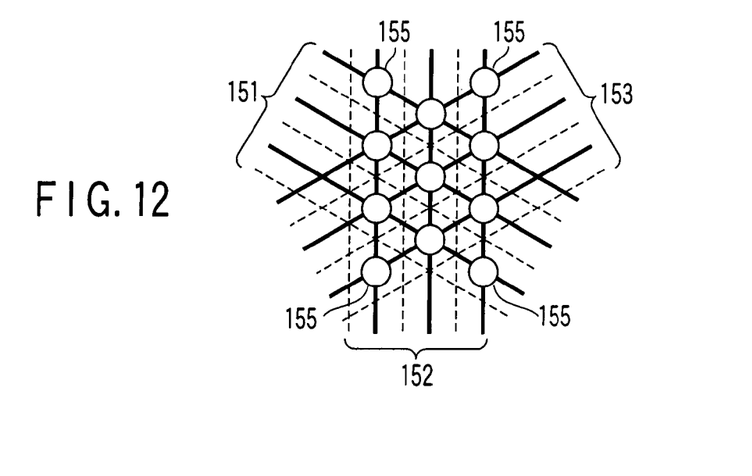
FIG. 12 is a diagram illustrating effects of an embodiment of the present invention.

FIG. 12 is a diagram schematically showing that the interference between the three diffraction lights 141*a* and 141*b* and 141*c* shown in FIG. 11 causes an image corresponding to the openings 122 shown in FIG. 8 to be formed on the substrate. The interference between the diffraction light 141*a* and the diffraction light 141*b* causes interference fringes 151 to be formed on the substrate. Similarly, the interference between the diffraction light 141*b* and the diffraction light 141*c* causes interference fringes 152 to be formed on the substrate. The interference between the diffraction light 141*c* and the diffraction light 141*a* causes interference fringes 153 to be formed on the substrate. Solid lines show bright portion peaks of the interference fringes. Dashed lines show dark portion peaks of the interference fringes. Light intensity is particularly high at portions 155 at which the bright portions of three interference fringes 151, 152, and 153 overlap. Therefore, the use of a positive photo resist forms hole patterns at the portions 155.

FIG. 12 shows an example in which the mask patterns shown in FIG. 8 are used. If such mask patterns as shown in FIG. 1 are used, only the hole patterns corresponding to the main openings can be formed in the photo resist by forming an image on the substrate at image intensities suitable for the sizes of the main openings and assist openings.

The most appropriate condition under which the three diffraction lights pass through the projection lens is that the three diffraction lights are at an equal distance from the center of the pupil. In this case, the interference fringes formed on the substrate do not depend on a z direction. This sufficiently increases the depth of focus.

Figure 13:
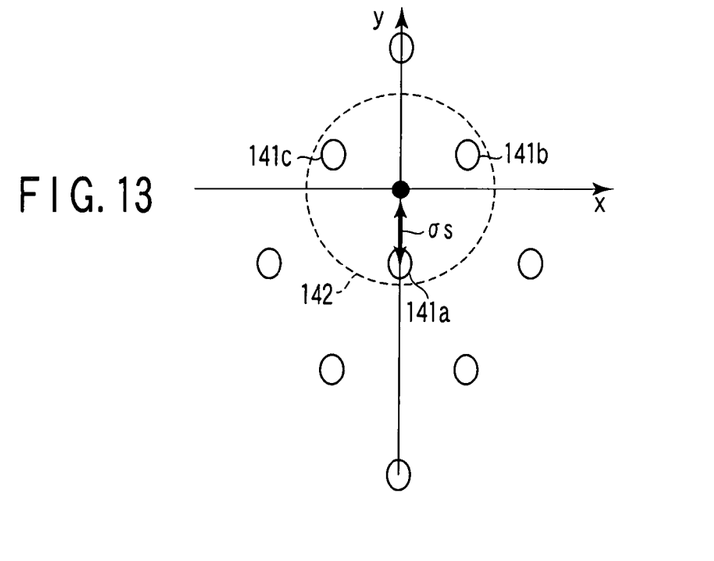
FIG. 13 is a diagram illustrating effects of an embodiment of the present invention.

The condition under which the three diffraction lights are at the equal distance from the center of the pupil is determined as described below. When the shift amount of the illumination is defined as σs, the coordinate positions of the three diffraction lights 141*a*, 141*b*, and 141*c* are as follows, as shown in FIG. 13.

141*a*: (0, −σs)
141*b*: (Qx, Qy−σs)
141*c*: (−Qx, Qy−σs)

As described above, Qx and Qy are expressed by:

$$Qx = \lambda/(2D \times NA)$$

$$Qy = \lambda/(2P \times NA)$$

Figure 14:
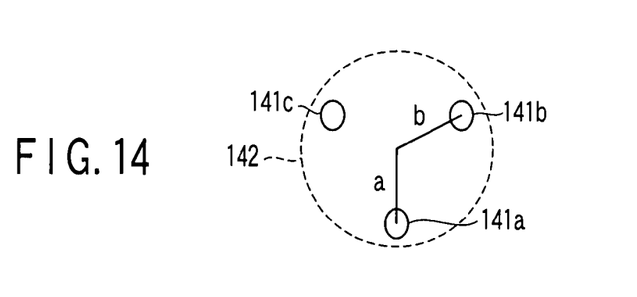
FIG. 14 is a diagram illustrating effects of an embodiment of the present invention.

Owing to the symmetry between the diffraction lights 141*a* and 141*b* and 141*c*, in FIG. 14, the condition "a=b" has only to be met. In this case, the following formulae are given.

$$a = \sigma s$$

$$b = (Qx^2 + (Qy - \sigma s)^2)^{1/2}$$

Since "a=b", the following formula is given.

$$\sigma s = (\lambda/4NA) \times ((P/D^2) + (1/P))$$

Therefore, the optimum position of the dipole illumination is obtained by shifting the illumination by the shift amount σs in the positive and negative directions of the y axis.

A discussion similar to the above also holds true for the quadrupole illumination. Consequently, for the quadrupole illumination, when the shift amount in the x axis direction is defined as σsx and the shift amount in the y axis direction is defined as σsy, the formulae are given.

$$\sigma sx = (\lambda/4NA) \times ((D/P^2) + (1/D))$$

$$\sigma sy = (\lambda/4NA) \times ((P/D^2) + (1/P))$$

Therefore, the optimum position of the quadrupole illumination is obtained by shifting the illumination by the shift amount σsx in the positive and negative directions of the x axis and by the shift amount σsy in the positive and negative directions of the y axis.

σsx corresponds to dx, shown in FIG. 2, and σsy corresponds to dy, shown in FIGS. 2 and 3.

As described above, according to the present embodiment, by using a photomask having assist openings such as those shown in FIG. 1 and using an illumination having light emitting areas such as those shown in FIG. 2 or 3, it is possible to form accurate hole patterns with dimensional errors inhibited even when the patterns are fine.

Embodiment 2

Now, a second embodiment of the present invention will be described. Basic matters of the second embodiment are similar to those of the first embodiment and will thus not be described in detail.

Figure 15:
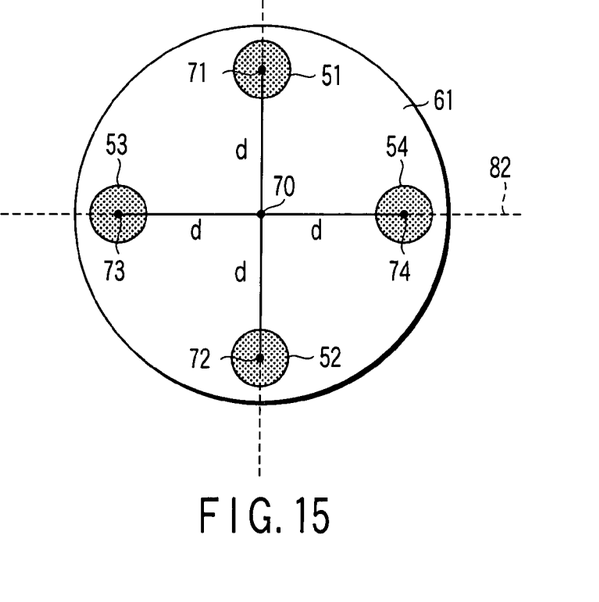
FIG. 15 is a diagram schematically showing an illumination in accordance with a second embodiment of the present invention.

FIG. 15 is a diagram schematically showing an illumination in accordance with the present embodiment.

As shown in FIG. 15, the illumination has the light emitting area (first light emitting area) 51, the light emitting area (second light emitting area) 52, the light emitting area (third light emitting area) 53, and the light emitting area (fourth light emitting area) 54. The light emitting areas 51, 52, 53, and 54 are surrounded by the non-light-emitting area 61.

The light emitting area 51 and the light emitting area 52 are symmetric with respect to the center 70 of the illumination. That is, the light emitting area 51 and the light emitting area 52 have the same shape and the same size. The center of the light emitting area 51 and the center of the light emitting area 52 are symmetric with respect to the center 70 of the illumination. The light emitting area 51 and the light emitting area 52 contain the point (first point) 71 and the point (second point) 72, respectively. The point 71 and the point 72 are symmetric with respect to the center 70 of the illumination. The point 71 and the point 72 are symmetric with respect to the straight line 82 extending in the word line direction (x direction, second direction) through the center 70 of the illumination. That is, the distance between the center 70 of the illumination and the point 71 is equal to the distance between the center 70 of the illumination and the point 72. Ideally, the center of the light emitting area 51 desirably coincides with the point 71. The center of the light emitting area 52 desirably coincides with the point 72. In this case, the light emitting area 51 and the light emitting area 52 are symmetric with respect to the straight line 82.

The light emitting area 53 and the light emitting area 54 are symmetric with respect to the center 70 of the illumination. That is, the light emitting area 53 and the light emitting area 54 have the same shape and the same size. The center of the light emitting area 53 and the center of the light emitting area 54 are symmetric with respect to the center 70 of the illumination. The light emitting area 53 and the light emitting area 54 contain the point (third point) 73 and the point (fourth point) 74, respectively. The point 73 and the point 74 are symmetric with respect to the center 70 of the illumination. The point 73 and the point 74 are symmetric with respect to the straight line 81 extending in the bit line direction (y direction, first direction) through the center 70 of the illumination. That is, the distance between the center 70 of the illumination and the point 73 is equal to the distance between the center 70 of the illumination and the point 74. Ideally, the center of the light emitting area 53 desirably coincides with the point 73. The center of the light emitting area 54 desirably coincides with the point 74. In this case, the light emitting area 53 and the light emitting area 54 are symmetric with respect to the straight line 81.

In the illumination in accordance with the present embodiment, the light emitting areas 51, 52, 53, and 54 all have the same shape and the same size. The distance between the center 70 of the illumination and the center of the light emitting area 51, the distance between the center 70 of the illumination and the center of the light emitting area 52, the distance between the center 70 of the illumination and the center of the light emitting area 53, and the distance between the center 70 of the illumination and the center of the light emitting area 54 are all equal. That is, in the illumination a coordinate system, each of these distances is d.

Further, for the illumination in accordance with the present embodiment, when D≧P, the distance d is expressed by:

$$(\lambda/4NA) \times ((P/D^2)+(1/P)) \geq d \geq (\lambda/4NA) \times ((D/P^2)+(1/D)) \quad \text{[Formula 3]}$$

When D<P, the distance d is expressed by:

$$(\lambda/4NA) \times ((D/P^2)+(1/D)) \geq d \geq (\lambda/4NA) \times ((P/D^2)+(1/P)) \quad \text{[Formula 4]}$$

Reference characters D, P, λ, and NA are as described in the first embodiment.

Also according to the present embodiment, by using a photomask having assist openings such as those shown in FIG. 1 and using an illumination having light emitting areas such as those shown in FIG. 15, it is possible to form accurate hole patterns with dimensional errors inhibited even when the patterns are fine.

Furthermore, the illumination shown in FIG. 15 is a typical quadrupole illumination. Even with such a typical quadrupole illumination, setting the distance d so as to satisfy Formulae 3 or 4, described above, enables the formation of accurate hole patterns with possible dimensional errors inhibited.

Embodiment 3

A third embodiment of the present invention will be described. Basic matters of the third embodiment are similar to those of the first embodiment and will thus not be described in detail.

Figure 16:
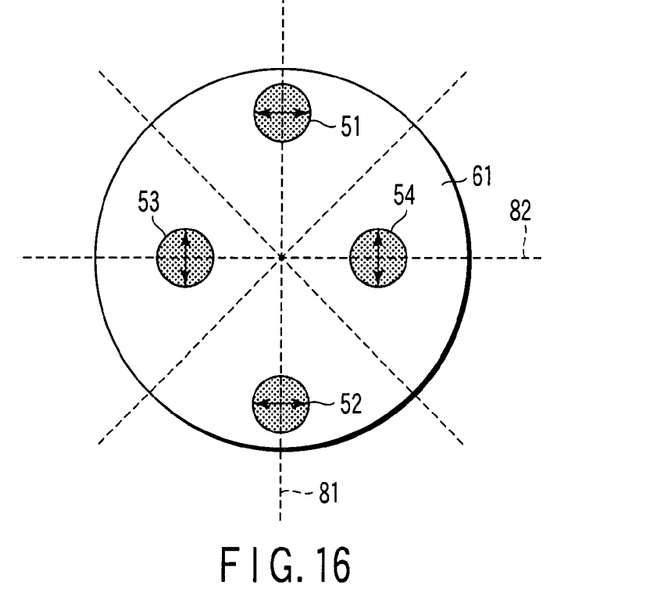
FIG. 16 is a diagram schematically showing a first example of an illumination in accordance with a third embodiment of the present invention.
Figure 17:
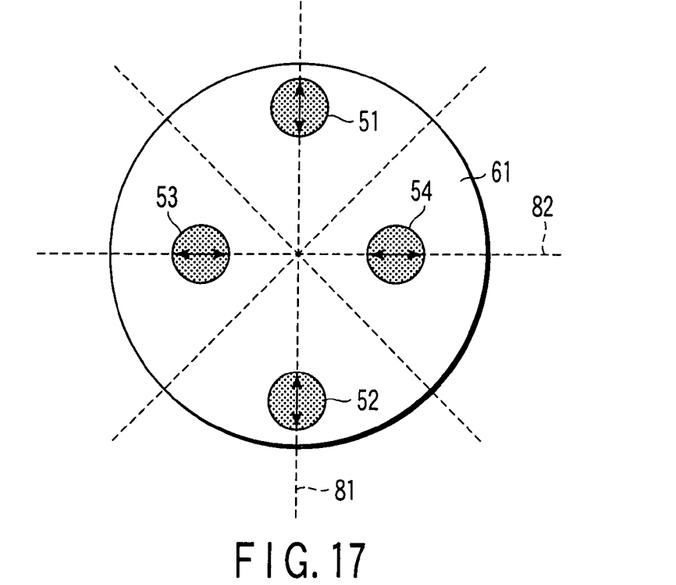
FIG. 17 is a diagram schematically showing a second example of the illumination in accordance with the third embodiment of the present invention.
Figure 18:
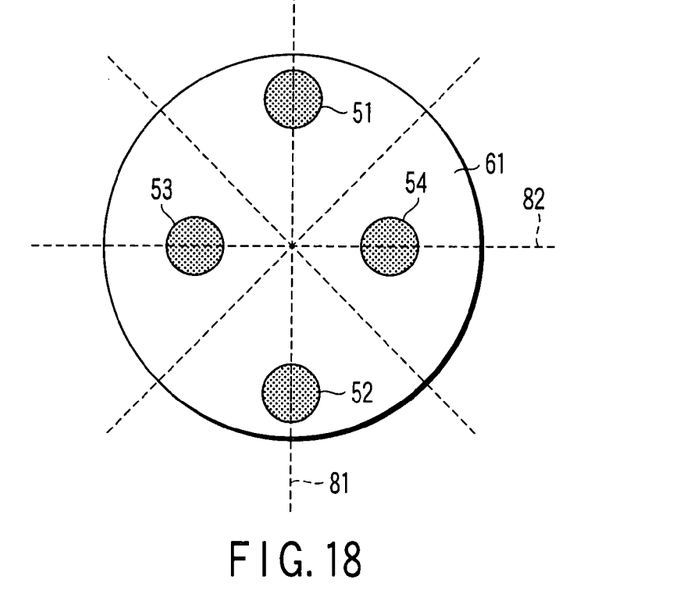
FIG. 18 is a diagram schematically showing a third example of the illumination in accordance with the third embodiment of the present invention.

FIGS. 16 to 18 are diagrams schematically showing a first example to a third example of an illumination in accordance with the present embodiment. Basic matters such as positions and shapes of the light emitting areas 51 to 54 are similar to those described in the first embodiment and the second embodiment.

In the first example shown in FIG. 16, the polarization state in each of the light emitting areas 51 to 54 is as follows. In the light emitting areas 51 and 52, a substantial polarization direction is the x direction (word line direction). In the light emitting areas 53 and 54, a substantial polarization direction is the y direction (bit line direction). More generally speaking, in the light emitting areas 51 and 52, the x direction component of the electric vector of the polarized light is greater than the y direction component of the electric vector of the polarized light. In the light emitting areas 53 and 54, the y direction component of the electric vector of the polarized light is greater than the x direction component of the electric vector of the polarized light. When the degree of polarization (DOP) is expressed by:

$$DOP = (|E1|^2 - |E0|^2)/(|E1|^2 + |E0|^2) \quad \text{[Formula 5]}$$

DOP is desirably at least 0.7. E1 is an electric vector component in a main direction, and E0 is an electric vector component in a direction vertical to the main direction. In the light emitting areas 51 and 52, E1 corresponds to the electric vector component in the x direction, and E0 corresponds to the electric vector component in the y direction. In the light emitting areas 53 and 54, E1 corresponds to the electric vector component in the y direction, and E0 corresponds to the electric vector component in the x direction.

In the second example shown in FIG. 17, the polarization state in each of the light emitting areas 51 to 54 is as follows. In the light emitting areas 51 and 52, a substantial polarization direction is the y direction (bit line direction). In the light emitting areas 53 and 54, a substantial polarization direction is the x direction (word line direction). More generally speaking, in the light emitting areas 51 and 52, the y direction component of the electric vector of the polarized light is greater than the x direction component of the electric vector of the polarized light. In the light emitting areas 53 and 54, the x direction component of the electric vector of the polarized light is greater than the y direction component of the electric vector of the polarized light. When the degree of polarization (DOP) is expressed by Formula 5, described above, DOP is desirably at least 0.7. In the light emitting areas 51 and 52, E1 corresponds to the electric vector component in the y direction, and E0 corresponds to the electric vector component in the x direction. In the light emitting areas 53 and 54, E1 corresponds to the electric vector component in the x direction, and E0 corresponds to the electric vector component in the y direction.

In the third example shown in FIG. 18, the light emitting areas 51 to 54 all involve a substantially unpolarized light. That is, each of the light emitting areas 51 to 54 emits light in which the electric vector component in the x direction is substantially equal to the electric vector component in the y direction.

In general, an illumination such as the one shown in FIG. 16 increases exposure latitude, while reducing the depth of focus. In contrast, an illumination such as the one shown in FIG. 17 reduces the exposure latitude, while increasing the depth of focus. An illumination such as the one shown in FIG. 18 achieves a state intermediate between the state of the illumination in FIG. 16 and the state of the illumination in FIG. 17. Which of the above illuminations is most suitable depends on various conditions. For example, which of the above illuminations is most suitable depends on the pitch (P) of mask patterns, inter-pattern distance (D), mask bias, intended resist pattern size, process conditions, and the like. It is desirable to use an illumination having the optimum polarization state for the conditions.

Basically, the present embodiment exerts effects similar to those described in the first and second embodiments by using a photomask having assist openings such as those shown in FIG. 1 and using an illumination having light emitting areas such as those shown in FIG. 2 or 15. Further, hole patterns can be more effectively formed by using an illumination having the optimum polarization state for the conditions.

Embodiment 4

A fourth embodiment of the present invention will be described. Basic matters of the fourth embodiment are similar to those of the first embodiment and will thus not be described in detail.

Figure 19:
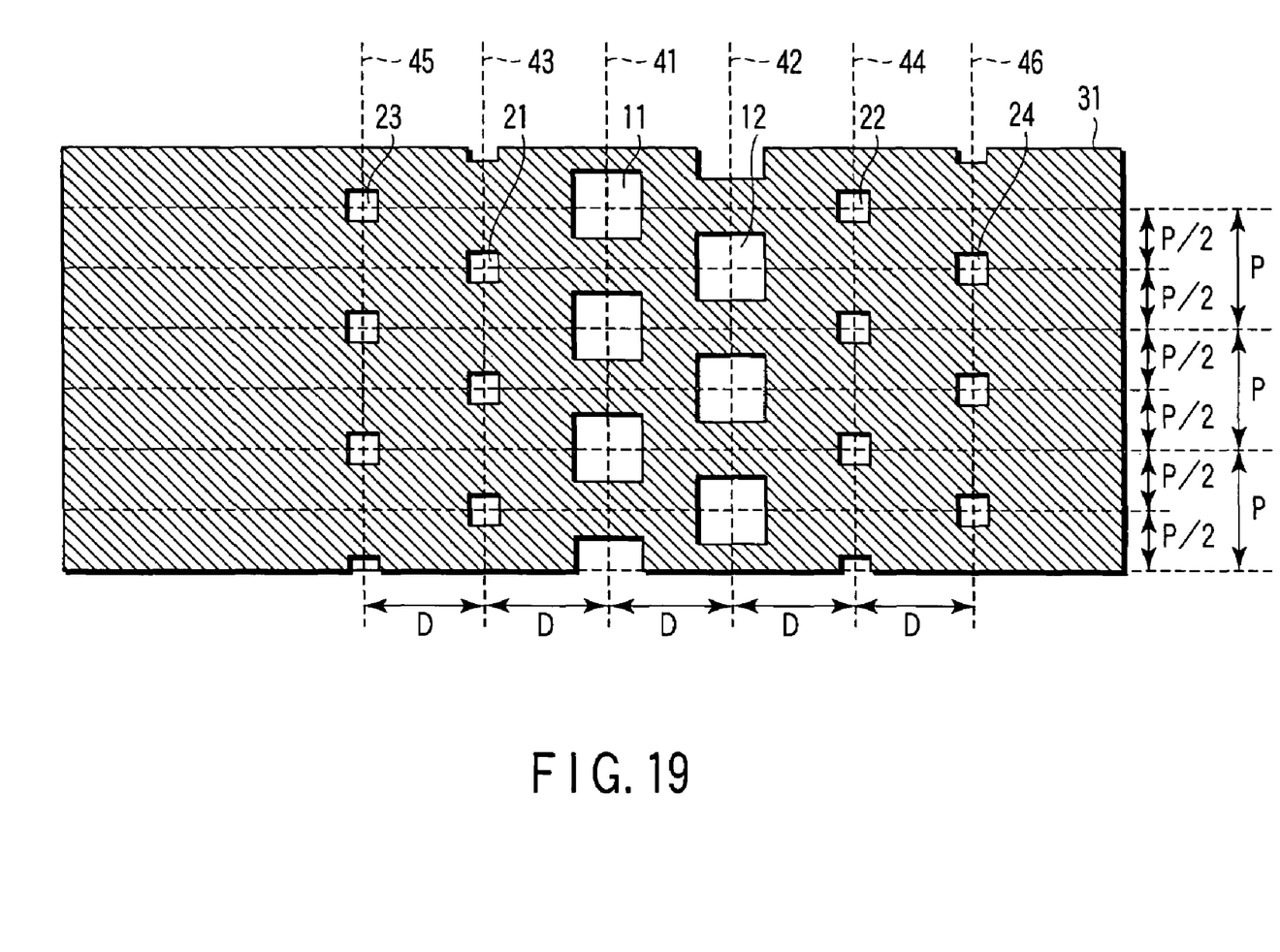
FIG. 19 is a diagram schematically showing a photomask in accordance with a fourth embodiment of the present invention.

FIG. 19 is a diagram schematically showing a photomask in accordance with the present embodiment.

The main openings (first main openings) 11, the main openings (second main openings) 12, the assist openings (first assist openings) 21, and the assist openings (second assist openings) 22 are similar to those in the photomask shown in FIG. 1 and will thus not be described in detail. The present embodiment further has assist openings (third assist openings) 23 and assist openings (fourth assist openings) 24.

The assist openings 21, 22, 23, and 24 have the same shape and the same size. Like the assist openings 21 and 22, the assist openings 23 and 24 constitute auxiliary patterns. After an exposure step and a development step, the patterns corresponding to the assist openings 23 and 24 are not formed in the photo resist.

The assist openings 23 are arranged at the pitch P on a straight line (fifth straight line) 45 extending in the bit line direction. That is, the center of each of the assist openings 23 is positioned on the straight line 45. The assist openings 24 are arranged at the pitch P on a straight line (sixth straight line) 46 extending in the bit line direction. That is, the center of each of the assist openings 24 is positioned on the straight line 46. The straight lines 45 and 46 are parallel to the other straight lines 41, 42, 43, and 44. The distance between the straight line 45 and the straight line 43 is defined as D. The distance between the straight line 46 and the straight line 44 is also defined as D. The assist openings 23 are displaced from the assist openings 21 by P/2 in the bit line direction. Similarly, the assist openings 24 are displaced from the assist openings 22 by P/2 in the bit line direction.

As is apparent from the above description, the assist openings 23, the assist openings 21, the main openings 11, the main openings 12, the assist openings 22, and the assist openings 24 are arranged at the same pitch in an oblique direction. That is, in addition to the assist openings 21 and 22, the photomask shown in FIG. 19 has the assist openings 23 and 24 and thus offers an improved periodicity in the oblique direction.

Any of the illuminations described in the first, second, and third embodiments may be used in this case.

As described above, also according to the present embodiment, by using a photomask having assist openings such as those shown in FIG. 19 and using an illumination such as any of the illuminations described in the first, second, and third embodiments, it is possible to form accurate hole patterns with dimensional errors inhibited even when the patterns are fine.

In FIG. 19, four columns of assist openings are formed. However, six or more columns of assist openings may be formed as in the case of the rule shown in FIG. 19.

In the above embodiments, the main openings and the assist openings are square, but may be, for example, rectangular, circular, or elliptical. Further, in the above embodiments, the light emitting areas in the illumination are circular, but may be, for example, elliptical.

Figure 20:
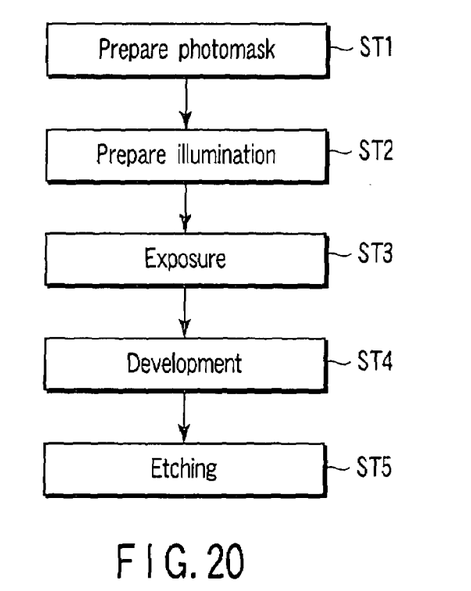
FIG. 20 is a flowchart showing a method for manufacturing a semiconductor device in accordance with an embodiment of the present invention.

The photomasks and illuminations described in the embodiments are applicable to the manufacture of semiconductor devices. FIG. 20 is a flowchart showing a method for manufacturing a semiconductor device using any of the above photomasks and illuminations.

First, a photomask and an illumination are prepared (ST1, ST2). Exposure is subsequently performed using the prepared photomask and illumination. That is, patterns formed on the photomask are transferred to a photo resist (ST3). The photo resist is subsequently developed, and photo resist patterns having hole patterns corresponding to main openings are formed (ST4). Further, etching is performed using the photo resist patterns as a mask, to form hole patterns on a semiconductor substrate (wafer) (ST5).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure method comprising:
preparing a photomask having first main openings and second main openings by which corresponding patterns are to be formed in a photo resist and first assist openings and second assist openings by which no corresponding patterns are to be formed in the photo resist;
preparing an illumination having a first light emitting area and a second light emitting area; and
irradiating the photo resist with illumination light from the illumination via the photomask,
the first main openings being arranged at a first pitch on a first straight line extending in a first direction,
the second main openings being arranged at the first pitch on a second straight line extending in the first direction and being away from the first straight line by a first distance, the second main openings being displaced relative to the first main openings by half the first pitch in the first direction,
the first assist openings being arranged at the first pitch on a third straight line extending in the first direction and being away from the first straight line by the first distance and away from the second straight line by double the first distance, the first assist openings being displaced relative to the first main openings by half the first pitch in the first direction,
the second assist openings being arranged at the first pitch on a fourth straight line extending in the first direction and being away from the second straight line by the first distance and away from the first straight line by double the first distance, the second assist openings being displaced relative to the second main openings by half the first pitch in the first direction,
the first light emitting area and the second light emitting area being symmetric with respect to a center of the illumination,
the first light emitting area and the second light emitting area containing a first point and a second point, respectively, the first point and the second point being symmetric with respect to the center of the illumination, the first point and the second point being symmetric with respect to a straight line extending through the center of the illumination in a second direction perpendicular to the first direction.

2. The method according to claim 1, wherein the first pitch is defined as P, the first distance is defined as D, a wavelength of the illumination light is defined as $\lambda$, a numerical aperture of a projection lens through which the illumination light passes is defined as NA, and a distance between the center of the illumination and the first point and a distance between the center of the illumination and the second point are each defined as dy in an illumination $\sigma$ coordinate system, the following relationship is satisfied:

$$dy=(\lambda/4NA)\times((P/D^2)+(1/P)).$$

3. The method according to claim 1, wherein the first main openings have the same shape and size as those of the second main openings.

4. The method according to claim 1, wherein the first assist openings have the same shape and size as those of the second assist openings.

5. The method according to claim 1, wherein the first light emitting area has the same shape and size as those of the second light emitting area.

6. The method according to claim 1, wherein a center of the first light emitting area coincides with the first point, and a center of the second light emitting area coincides with the second point.

7. The method according to claim 1, wherein the photomask further has third assist openings and fourth assist openings by which no corresponding patterns are to be formed in the photo resist,
the third assist openings are arranged at the first pitch on a fifth straight line extending in the first direction and being away from the third straight line by the first distance and away from the first straight line by double the first distance, the third assist openings being displaced relative to the first assist openings by half the first pitch in the first direction, and the fourth assist openings are arranged at the first pitch on a sixth straight line extending in the first direction and being away from the fourth straight line by the first distance and away from the second straight line by double the first distance, the fourth assist openings being displaced relative to the second assist openings by half the first pitch in the first direction.

8. The method according to claim 7, wherein the first assist openings, the second assist openings, the third assist openings, and the fourth assist openings all have the same shape and size.

9. The method according to claim 1, wherein the illumination further has a third light emitting area and a fourth light emitting area, the third light emitting area and the fourth light emitting area are symmetric with respect to the center of the illumination, and the third light emitting area and the fourth light emitting area contain a third point and a fourth point, respectively, the third point and the fourth point being symmetric with respect to the center of the illumination, the third point and the fourth point being symmetric with respect to a straight line extending in the first direction through the center of the illumination.

10. The method according to claim 9, wherein the first pitch is defined as P, the first distance is defined as D, a wavelength of the illumination light is defined as $\lambda$, a numerical aperture of a projection lens through which the illumination light passes is defined as NA, and a distance between the center of the illumination and the third point and a distance between the center of the illumination and the fourth point are each defined as dx in an illumination $\sigma$ coordinate system, the following relationship is satisfied:

$$dx=(\lambda/4NA)\times((D/P^2)+(1/D)).$$

11. The method according to claim 9, wherein the third light emitting area has the same shape and size as those of the fourth light emitting area.

12. The method according to claim 9, wherein a center of the third light emitting area coincides with the third point, and a center of the fourth light emitting area coincides with the fourth point.

13. The method according to claim 9, wherein a distance between the center of the illumination and the first point, a distance between the center of the illumination and the second point, a distance between the center of the illumination and the third point, and a distance between the center of the illumination and the fourth point are all the same.

14. The method according to claim 13, wherein the first pitch is defined as P, the first distance is defined as D, a wavelength of the illumination light is defined as $\lambda$, a numerical aperture of a projection lens through which the illumination light passes is defined as NA, and the distance between the center of the illumination and the first point, the distance between the center of the illumination and the second point, the distance between the center of the illumination and the third point, and the distance between the center of the illumination and the fourth point are each defined as d in an illumination $\sigma$ coordinate system, the following relationship is satisfied:

$$D\geq P,$$

$$(\lambda/4NA)\times((P/D^2)+(1/P))\geq d\geq(\lambda/4NA)\times((D/P^2)+(1/D)).$$

15. The method according to claim 13, wherein the first pitch is defined as P, the first distance is defined as D, a wavelength of the illumination light is defined as $\lambda$, a numerical aperture of a projection lens through which the illumination light passes is defined as NA, and the distance between the center of the illumination and the first point, the distance between the center of the illumination and the second point, the distance between the center of the illumination and the third point, and the distance between the center of the illumination and the fourth point are each defined as d in an illumination $\sigma$ coordinate system, the following relationship is satisfied:

$$D<P,$$

$$(\lambda/4NA)\times((D/P^2)+(1/D))\geq d\geq(\lambda/4NA)\times((P/D^2)+(1/P)).$$

16. The method according to claim 9, wherein a substantial direction of electric vector vibration of light in the first and second light emitting areas corresponds to the first direction, and a substantial direction of electric vector vibration of light in the third and fourth light emitting areas corresponds to the second direction.

17. The method according to claim 9, wherein a substantial direction of electric vector vibration of light in the first and second light emitting areas corresponds to the second direction, and a substantial direction of electric vector vibration of light in the third and fourth light emitting areas corresponds to the first direction.

18. The method according to claim 9, wherein light in the first, second, third, and fourth light emitting areas are substantially unpolarized light.

19. The method according to claim 1, wherein the first and second main openings are used to form contact holes.

20. A method for manufacturing a semiconductor device, the method comprising:

exposing a photo resist by the method according to claim 1; and developing the exposed photo resist to form a photo resist pattern.

* * * * *